US006618184B2

(12) United States Patent
Jin et al.

(10) Patent No.: US 6,618,184 B2
(45) Date of Patent: Sep. 9, 2003

(54) DEVICE FOR USE WITH A MICRO-ELECTRO-MECHANICAL SYSTEM (MEMS) OPTICAL DEVICE AND A METHOD OF MANUFACTURE THEREFOR

(75) Inventors: Sungho Jin, Millington, NJ (US); Hareesh Mavoori, Piscataway, NJ (US); Roland Ryf, Aberdeen, NJ (US)

(73) Assignees: Agere Systems Inc., Allentown, PA (US); Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/825,016

(22) Filed: Apr. 3, 2001

(65) Prior Publication Data

US 2002/0141036 A1 Oct. 3, 2002

(51) Int. Cl.[7] .............................................. G02B 26/00
(52) U.S. Cl. ........................ 359/291; 359/290; 359/230; 359/214
(58) Field of Search .................. 359/291, 838, 359/850, 862, 290, 214, 224, 230, 222; 257/418, 420; 73/504.09, 514.17

(56) References Cited

U.S. PATENT DOCUMENTS

| | | | | |
|---|---|---|---|---|
| 6,377,535 B1 | * | 4/2002 | Chen et al. ............ | 369/112.09 |
| 6,392,220 B1 | * | 5/2002 | Slater et al. ................ | 250/216 |
| 6,396,789 B1 | * | 5/2002 | Guerra et al. ............... | 369/112 |
| 2002/0071166 A1 | * | 6/2002 | Jin et al. .................... | 359/224 |
| 2002/0071169 A1 | * | 6/2002 | Bowers et al. ............. | 359/291 |
| 2002/0075554 A1 | * | 6/2002 | Brophy et al. ............. | 359/291 |
| 2002/0097952 A1 | * | 7/2002 | Jin et al. ...................... | 385/18 |
| 2002/0105725 A1 | * | 8/2002 | Sweat et al. ................ | 359/566 |

OTHER PUBLICATIONS

L. Y. Lin, E.L. Goldstein and R. W. Tkach; "Free Space Micromachined Optical Switches with Submillisecond Switching Time for Large–Scale Optical Rossconnects"; IEEE Photonics Technology Letters, vol. 10; No. 4, Apr. 1998; pp. 525–527.

Raanan A. Miller and Yu–Chong Tai; "Micromachined Electromagnetic Scanning Mirrors"; 1997 Society of Photo–Optical Instrumentation Engineers; pp. 1399–1407.

Jack W. Judy and Richard S. Muller; "Magnetic Microactuation of Torsional Polysilicon Structures"; Sensors and Actuator A53 (1996); pp. 392–397.

William D. Cowan and Victor M. Bright; Vertical Thermal Actuators for Micro–Opto–Electro–Mechanical Systems; SPIE vol. 3226; pp. 137–146.

* cited by examiner

Primary Examiner—Jordan M. Schwartz
Assistant Examiner—Jessica Stultz

(57) ABSTRACT

A device for use in a micro-electro-mechanical system (MEMS) optical system. The device includes a substrate having opposing first and second sides, wherein the first side has a light reflective optical layer located thereover, and the second side is an irregular surface.

55 Claims, 15 Drawing Sheets

DEVICE FOR USE WITH A MICRO-ELECTRO-MECHANICAL SYSTEM (MEMS) OPTICAL DEVICE AND A METHOD OF MANUFACTURE THEREFOR

TECHNICAL FIELD OF THE INVENTION

The present invention is directed, in general, to an optical device and, more specifically, to an improved mirror or an array of improved mirrors for use with a micro-electro-mechanical system (MEMS) optical device, and a method of manufacture therefor.

BACKGROUND OF THE INVENTION

Optical communication systems typically include a variety of optical devices, for example, light sources, photo detectors, switches, cross connects, attenuators, mirrors, amplifiers, and filters. The optical devices transmit optical signals in the optical communications systems. Some optical devices are coupled to electro-mechanical structures, such as thermal actuators, forming an electro-mechanical optical device. The term electro-mechanical structure, as used herein, refers to a structure that moves mechanically under the control of an electrical signal.

Some electro-mechanical structures move the optical devices from a predetermined first position to a predetermined second position. Cowan, William D., et al., "Vertical Thermal Actuators for Micro-Opto-Electro-Mechanical Systems," SPIE, Vol. 3226, pp. 137–146 (1997), describes one such electro-mechanical structure useful for moving optical devices in such a manner.

These micro-electro-mechanical systems (MEMS) optical devices often employ a periodic array of micro-machined mirrors, each mirror being individually movable in response to an electrical signal. For example, the mirrors can each be cantilevered and moved by an electrostatic, piezoelectric, magnetic, or thermal actuation. See articles by L. Y. Lin, et al., IEEE Photonics Technology Lett. Vol. 10, p. 525, 1998, R. A. Miller, et al. Optical Engineering Vol. 36, p. 1399, 1997, and by J. W. Judy et al., Sensors and Actuators, Vol. A53, p.392, 1996, which are incorporated herein by reference.

The mirrors used in these optical devices are typically made up of a material which reflects light with high reflectivity at a desired operating wavelength of the light, for example an operating wavelength ranging from about 800 nm to about 1600 nm for $SiO_2$ optical fiber-based telecommunication systems. Some examples of such reflective materials are gold, silver, rhodium, platinum, copper and aluminum. These reflective metal films typically have a thickness ranging from about 20 nm to about 2000 nm, and are deposited on a movable membrane substrate such as a silicon substrate. At least one adhesion-promoting bond layer is desirably added between the reflective metal film and the substrate in order to prevent the reflective metal film from getting peeled off.

A typical MEMS mirror comprises a metal-coated silicon mirror movably coupled to a surrounding silicon frame via a gimbal. Two torsional members on opposite sides of the mirror connect the mirror to the gimbal, and on opposite sides of the mirror, define the mirror's axis of rotation. The gimbal, in turn, is coupled to the surrounding silicon frame via two torsional members defining a second axis of rotation orthogonal to that of the mirror. Using the typical MEMS mirror, the light beam can be reflected and steered in any direction.

Commonly, electrodes are disposed in a cavity underlying the mirror and the gimbal. Voltages applied between the mirror and an underlying electrode, and between the gimbal and an electrode, control the orientation of the mirror. Alternatively, an electrical signal can control the position of the mirror magnetically or piezoelectrically.

Turning to Prior Art FIGS. 1 and 2, illustrated is a typical MEMS mirror device and its application. FIG. 1 illustrates a prior art optical MEMS mirror device 100. The device 100 comprises a mirror 110 coupled to a gimbal 120 on a polysilicon frame 130. The components are fabricated on a substrate (not shown) by micromachining processes such as multilayer deposition and selective etching. After etching, the mirror 110, the gimbal 120 and the polysilicon frame 130, are raised above the substrate by upward bending lift arms 140, typically using a release process. The mirror 110 in the example illustrated in FIG. 1, is double-gimbal cantilevered and attached onto the polysilicon frame 130 by springs 150. The mirror 110 can be tilted to any desired orientation for optical signal routing via electrostatic or other actuation, using electrical voltage or current supplied from outside. Typically, the mirror 110 includes a light-reflecting mirror surface 160 coated over a polysilicon membrane 170, which is typically of circular shape. The light-reflecting mirror surface 160 is generally deposited by known thin film deposition methods, such as evaporation, sputtering, electrochemical deposition, or chemical vapor deposition.

Turning briefly to Prior Art FIG. 2, illustrated is an important application of the mirror 110 illustrated in FIG. 1. FIG. 2 illustrates an optical cross connect system 200 for optical signal routing, including an array of mirrors 210. The optical cross connect system 200 shown in FIG. 2 includes an optical input fiber 220, an optical output fiber 230 and the array of MEMS mirrors 210, including a primary mirror 212 and an auxiliary mirror 215. As is illustrated, an optical signal from the input fiber 220 is incident on the primary mirror 212. The primary mirror 212, with the aid of the auxiliary mirror 215, is electrically controlled to reflect the incident optical signal to the optical output fiber 230. In alternative schemes, the input fibers and the output fibers are in separate arrays, and a pair of MEMS mirror arrays are used to perform the cross connect function.

The tilting of each mirror is controlled by applying specific electric fields to one or more of the electrodes beneath the mirror. Undesirable variations in the gap spacing between the mirror layer and the electrode layer, symmetric or nonsymmetric, may alter the electric field for the applied field, which affects the degree of electrostatic actuation and hence the degree of mirror tilting. This in turn alters the path or coherency of light signals reaching the receiving fibers, thus increasing the signal loss during beam steering.

An array of such MEMS mirrors is essentially composed of two layers: a mirror layer comprising the array of mirror elements movably coupled to a surrounding frame, and an actuator layer comprising the electrodes and conductive paths needed for electrical control of the mirrors. One approach to fabricating the array is to fabricate the actuator layer and the mirror layer as successive layers on the same workpiece and then to lift up the mirror layer above the actuator layer using vertical thermal actuators or using stresses in thin films.

An alternative approach is to fabricate the mirror layer on one substrate, the actuator layer on a separate substrate and then to assemble the mating parts with accurate alignment and spacing. A two-part assembly process is described in U.S. Pat. No. 5,629,790 issued to Neukermans et al. on May 13, 1997, which is incorporated herein by reference. Such two-part assembly processes generally provide a more robust structure, greater packing density of the movable mirrors, and permits larger mirror sizes and rotation angles, as well as being easily scalable for larger arrays using silicon fabrication processes. The movable membrane in such a MEMS device is preferably made of single crystal silicon, and is typically only several micrometers thick. Such a thin silicon membrane is made, for example, by using the well-known silicon-on-insulator (SOI) fabrication process. The SOI process allows a convenient way of fabricating a thin silicon membrane, and the presence of a buried oxide layer is useful as an etch-stop barrier in photolithographical fabrication of the mirror, gimbal and spring/torsion bar structures. Selected patterned areas of the SOI substrate are etched, e.g., by using chemical etch, reactive-ion etch, or a combination of these processes to form the mirror array pattern with cavity structure. The gimbals and the torsion bars are also formed around each mirror. The SOI material and process are described, for example, in *Concise Encyclopedia of Semiconducting Materials and Related Technologies*, Edited by S. Mahajan and L. C. Kimmerling, Pergamon Press, New York, 1992, p. 466.

Various challenges and problems currently exist with the above mentioned MEMS devices. Solutions to these and other problems are presently being sought. Accordingly, what is needed in the art is a micro-electro-mechanical system optical device, and a method of manufacture therefore, that does not encounter the problems of the prior art devices.

SUMMARY OF THE INVENTION

To address the above-discussed deficiencies of the prior art, the present invention provides a system or device (e.g., micro-electro-mechanical system (MEMS) systems or devices), for use in an optical device. The device includes a substrate having opposing first and second sides, wherein the first side has a light reflective optical layer located thereover, and the second side is an irregular surface.

The present invention is further directed to a method of manufacturing the mirror. The method includes (1) forming a substrate having opposing first and second sides, wherein the second side has an irregular surface, and (2) forming a light reflective optical layer over the first side.

In addition to that disclosed above, the present invention is also directed to an optical communications system. The optical communications system includes input/output fiber bundles, a micro-electro-mechanical structure including the mirror, imaging lenses interposed between the input/output fiber bundles and the micro-electro-mechanical structure, and a reflector.

The foregoing has outlined an exemplary embodiment of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

Prior Art

Prior Art

DETAILED DESCRIPTION

In surface-micro-machined optical MEMS devices, such as optical cross-connects, the movable mirrors are often made of polysilicon membranes, and are coated with a light-reflecting metal such as gold or aluminum on the top surface. It has been found that the deposition of such metallization films introduces stresses in the mirror, which tends to cause undesirable mirror curving. This may be due to a number of different reasons, such as a film-substrate mismatch in the coefficient of thermal expansion (CTE), a mismatch in the lattice parameter, nonequilibrium atomic arrangement in the film, inadvertent or intentional incorporation of impurity atoms, etc. The presence of such stresses tends to cause a variety of dimensional instability problems, especially if the substrate is relatively thin, as is the case in the MEMS membranes, which are usually only several-micrometers thick. Other examples of the stress caused dimensional problems in the MEMS mirror structure, may include: i) undesirable bowing of the mirror substrate (membrane), which results in a non-focused or nonparallel light reflection and an increased loss of optical signal, ii) time-dependent change in mirror curvature due to the creep or stress relaxation in the reflective metal film, bond layer or the membrane substrate, and iii) temperature-dependent change in mirror curvature due to the altered stress states and altered CTE mismatch conditions in the metal film, bond layer, and membrane substrate materials, with changing temperature.

Figure 1:
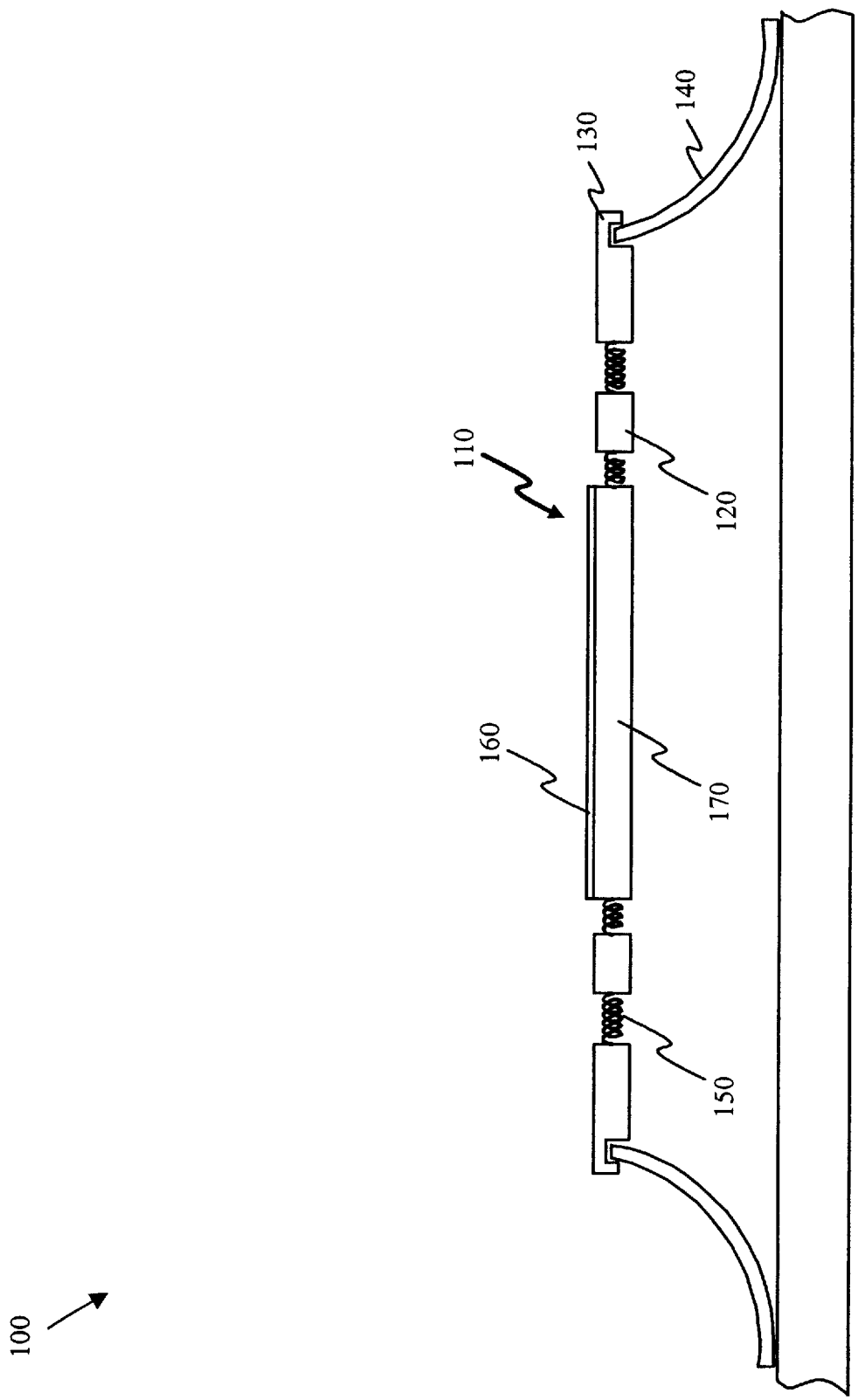
FIG. 1 illustrates a traditional surface-micro machined-type MEMS device.
Figure 2:
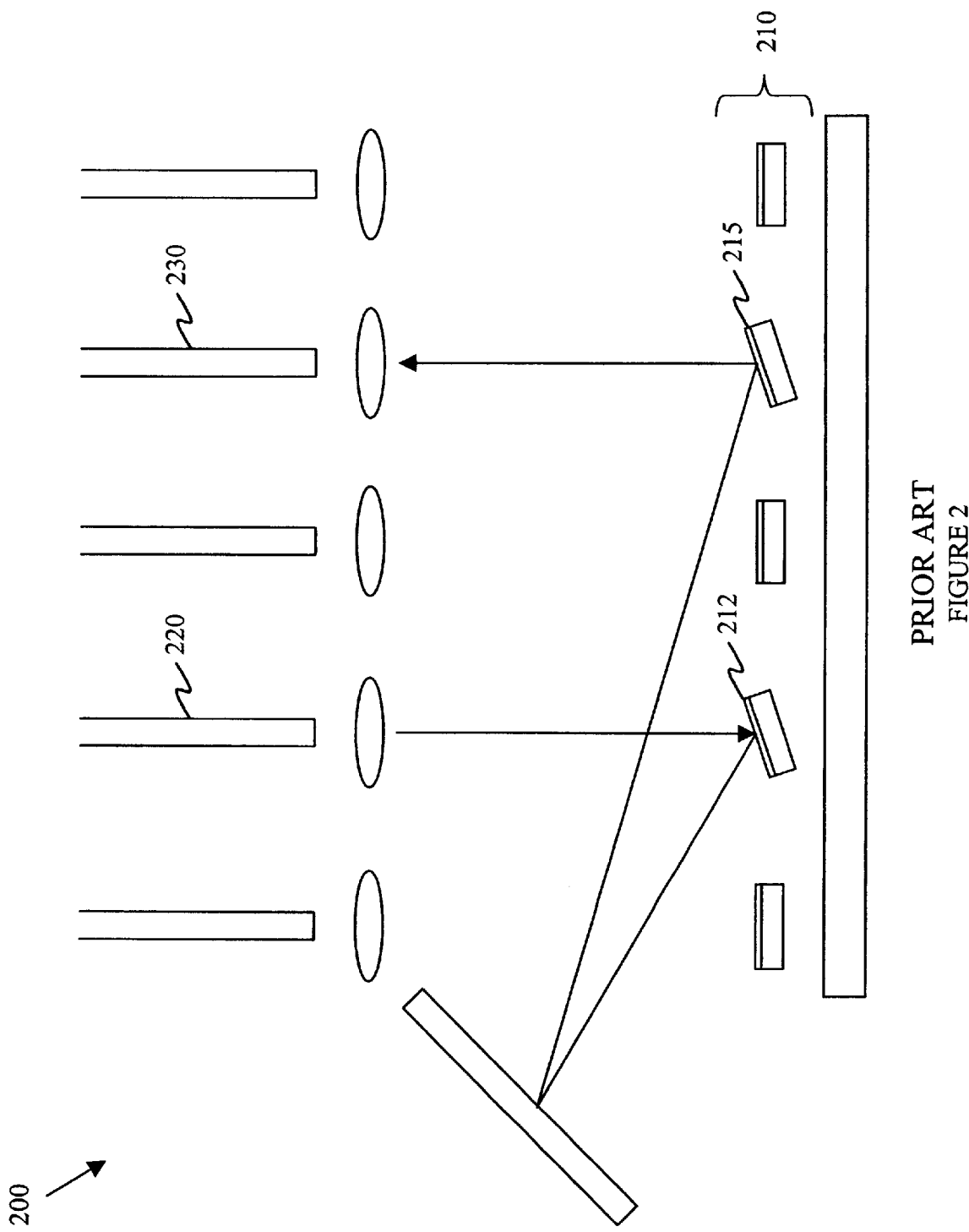
FIG. 2 illustrates an optical cross connect system for optical signal routing, including an array of traditional surface-machines-type MEMS device.
Figure 3:
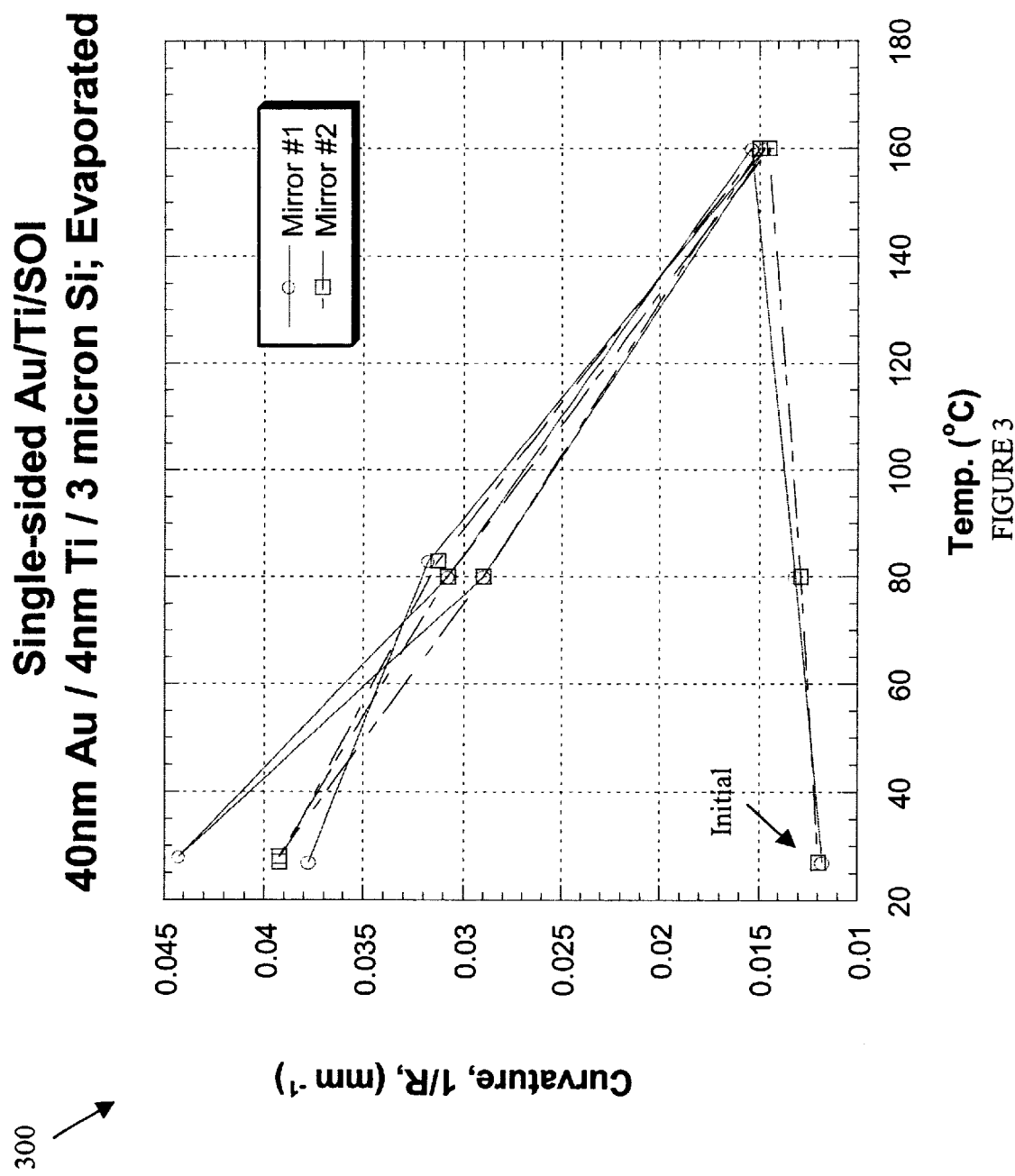
FIG. 3 illustrates a graph that depicts experimental data showing mirror curvature and temperature dependent change problems arising from the use of single-sided metallization on a Si MEMS membrane.

Turning initially to FIG. 3, shown is a graph 300 that illustrates experimental data showing the mirror curvature and temperature dependent change problems arising from the use of single-sided metallization on a Si MEMS membrane. As is evident from FIG. 3, the single-sided metallization produces undesirable mirror curvature as well as a severe temperature-dependent change in curvature, both of which are undesirable for light beam steering applications such as optical cross-connects. In the current example, the primary reason for the curvature formation is most likely the stress caused by the substantial mismatch in the coefficient of thermal expansion (CTE) between the Si membrane (about $4 \times 10^{-6}/°$ C.) and the metallization (about $14 \times 10^{-6}/°$ C.), although the film growth-related stresses may also contribute.

Achieving a flat mirror with a small curvature is essential in order to minimize optical losses associated with such non-flat mirrors. In addition, ensuring a small curvature with a low or negligible temperature dependence of mirror curvature is important, as the optical MEMS mirrors are often subjected to high temperature exposure for the purpose of assembly, packaging and other manufacturing processes, as well as to fluctuations in ambient temperature during operation. It has been found that one way of correcting such curvature and restoring flat mirror geometry is to employ ion implantation which introduces a compressive stress to cancel out the existing tensile stress in the curved (often concave upward) mirrors.

Figure 4:
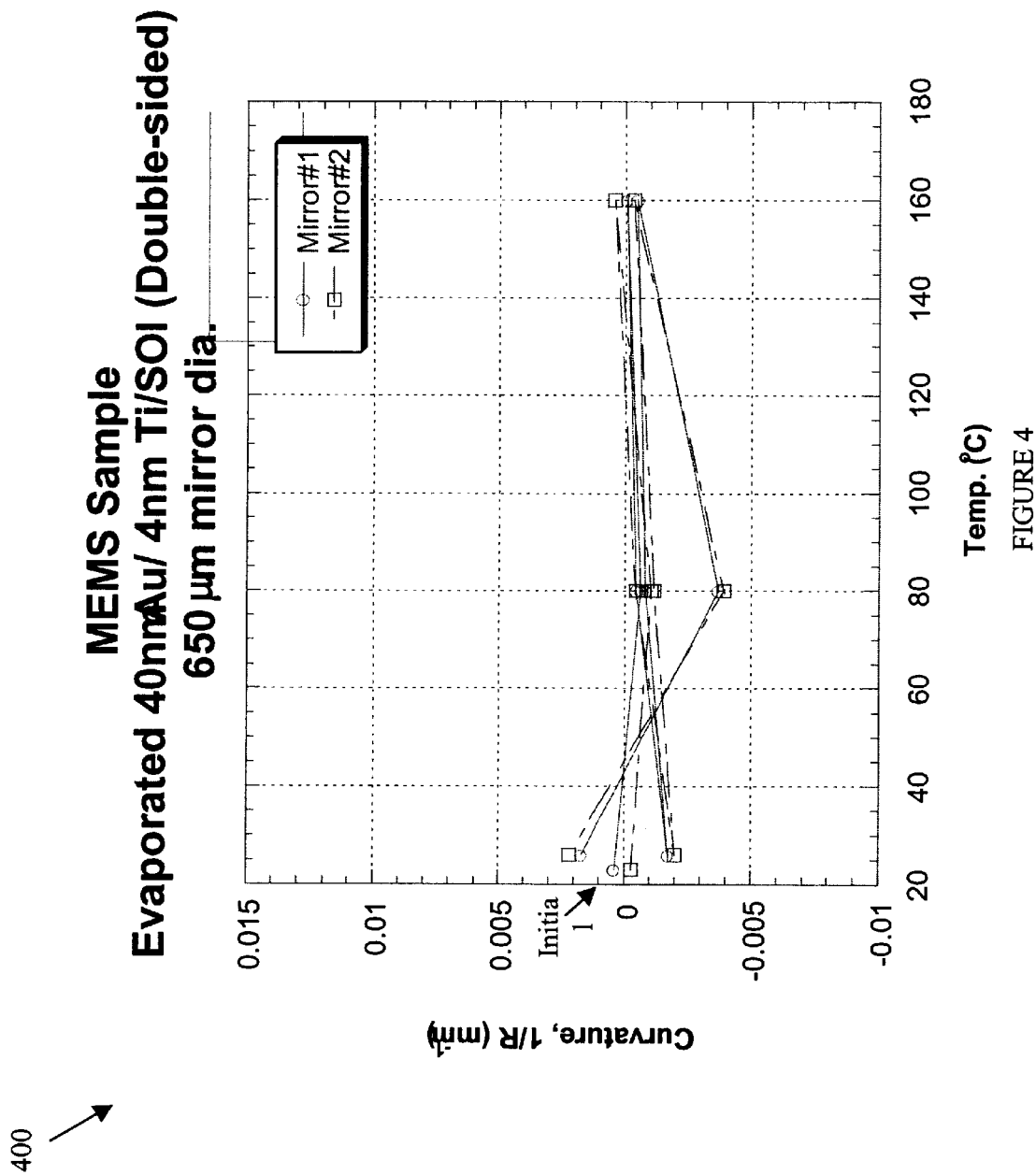
FIG. 4 illustrates a graph that depicts experimental data showing the benefits arising from the use of double-sided metallization on a Si MEMS membrane.

Such an undesirable mirror curvature in one-side metallized silicon membrane is also seen in the case of the two-part MEMS assembly structure where the mirror layer is, for example, made of the single crystal silicon membrane fabricated from the SOI substrate, and is then subsequently bonded to the electrode layer to form the actuateable MEMS device. However, in this case, both sides of the mirror layer are available for metallization, and it has been found that the mirror curvature problem can thus be resolved through using a double-layered metallization, i.e., by depositing the same metallization in exactly the same thickness onto both the top and the bottom surface of the silicon membrane, so that the metallization-induced stresses are balanced. Turning briefly to FIG. 4, shown is a graph 400 that illustrates experimental data showing the benefits arising from the use of double-sided metallization on the Si MEMS membrane. As can be noticed from FIG. 4, the mirror is substantially flat and contains only a small temperature dependence of curvature.

Figure 5:
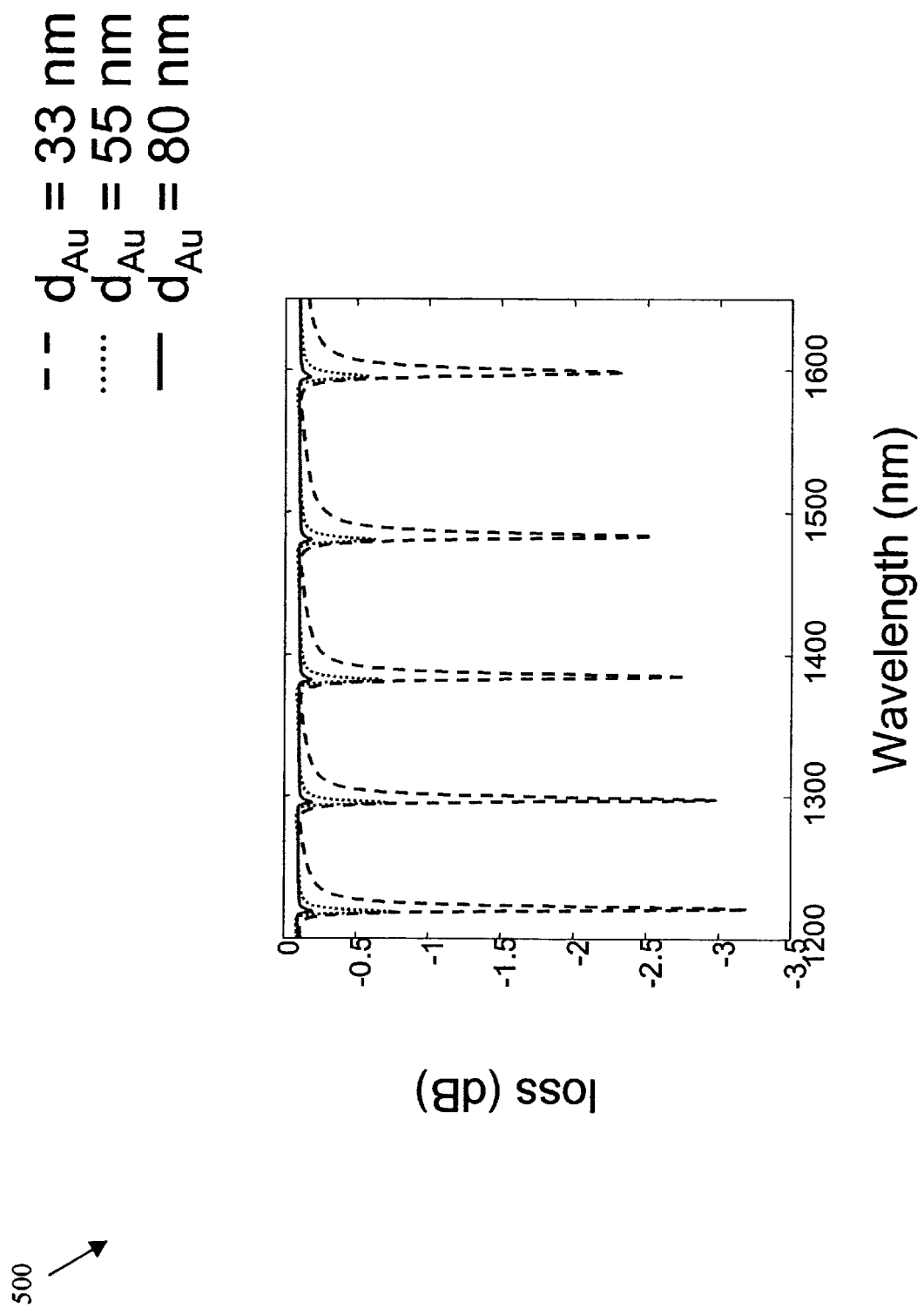
FIG. 5 illustrates a calculation of Fabry-Perot (F-P) interferrometric loss in an optical signal reflected from a 3 $\mu$m thick MEMS silicon membrane mirror coated double-side with varying thicknesses of gold metallizations.

The presence of two parallel, highly reflective surfaces at the top and bottom surfaces of the silicon membrane, however, introduces multiple light reflections within the silicon membrane, and tends to cause undesirable optical interference and signal loss. The optical interference and signal loss, which is generally referred to as Fabry-Perot (F-P) interferrometric loss, and is more thoroughly discussed in the book by E. Hecht, Optics, 3rd edition, Addison-Wesley, New York, 1998, p. 413–416, is illustrated in FIG. 5. The data in FIG. 5 represents the calculation of F-P interferrometric loss in an optical signal reflected from a 3 $\mu$m thick MEMS silicon membrane mirror coated double-side with varying thicknesses of gold metallizations. As is evident from FIG. 5, the presence of Fabry-Perot cavity, with the light beam repeatedly reflecting from the two bounding metallization mirror layers (double-sided Au metallizations), introduces non-uniform wavelength-dependent F-P interferrometric loss, which is especially significant for the thinner metallizations. If the metallization thickness is increased, e.g., to about 80 nm as in FIG. 3, the F-P loss is progressively reduced, although not completely.

The use of the thicker metallization layer, however, poses another problem of adding too much weight to the movable membrane. Gold, which as previously mentioned may act as one metallization material, has a density of 19.32 g/cm$^3$, which is more than about 8 times heavier than the Si membrane material (density=2.33 g/cm$^3$). Increasing the gold thickness from about 33 nm to about 80 nm on both sides of the 3 $\mu$m thick Si membrane would increase the overall weight of the movable membrane by more than about 25%. Such an increase in the mass of the movable membrane is not desirable, as it affects the dynamics of mirror movement and slows down the response time substantially, and further, the resonance frequency of the mirror will be reduced, increasing the sensitivity to external mechanical perturbations during operation. In addition, the increase of mass on the MEMS spring regions raises the stiffness of the spring, and hence the actuation voltage to move the mirror by a given displacement or tilt angel will have to be increased significantly.

Figure 6:
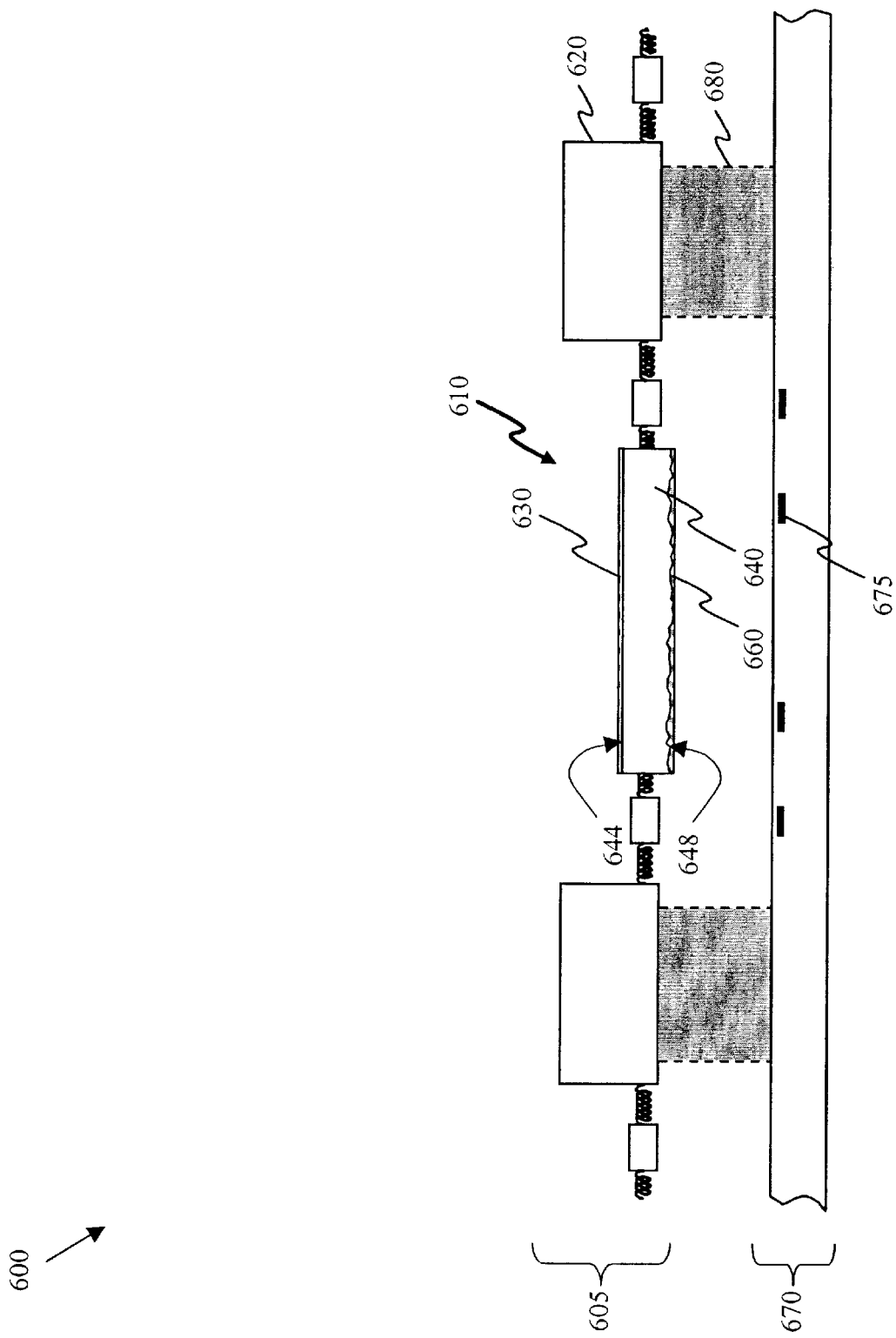
FIG. 6 illustrates one embodiment of a completed micro-electro-mechanical system (MEMS) optical device, including a mirror, which is in accordance with the present invention.

It is desirable to have a double-side metallized MEMS mirrors so that the flatness of the mirrors is maintained, yet at the same time such Fabry-Perot interference loss is prevented or minimized. Turning to FIG. 6, illustrated is such a device. FIG. 6 illustrates one embodiment of an exemplary two-part optical MEMS device 600, including an actuating layer 605 having a mirror 610, which is in accordance with the present invention. As illustrated in FIG. 6, the actuating layer 605 includes the mirror 610 and a mounting substrate 620, on which the mirror 610 is moveably mounted. The mirror 610 includes a mirror substrate 640 having opposing first and second sides 644, 648, respectively, wherein the second side 648 is an irregular surface. The term "irregular surface," as defined herein, means a surface having topographical aberrations, whether additive or subtractive, which renders the surface as a whole non-planar. The mirror further includes a light reflective optical layer 630 located over the first side 644. In the illustrative embodiment shown in FIG. 6, a stress balancing layer 660 may be further located over the second side 648, to compensate for stress caused by the light reflective optical layer 630. If the stress balancing layer 660 is used, it may comprise the same material or a different material as the light reflective optical layer 630. It should be noted that the embodiments illustrated in FIG. 6 and throughout the remainder of this document, are discussed without respect to orientation.

The two-part optical MEMS device 600 may further include an electrode layer 670, including at least one actuating electrode 675, and leads (not shown), for applying voltage between the electrode 675 and the mirror 610. The actuating layer 605 is mechanically attached, e.g., by solder bonding or epoxy bonding, to the electrode layer 670 with a controlled vertical gap spacing, which can be controlled, e.g., by using a fixed thickness spacer 680.

The mirror 610, including the second side 648 having an irregular surface, exhibits substantially reduced Fabry-Perot (F-P) interferrometric loss as compared to an identical mirror without the irregular surface. For example, in an advantageous embodiment of the present invention, the use of the second side 648 having an irregular surface reduces Fabry-Perot (F-P) interferrometric loss by at least about 20% for operating wavelengths of about 1.55 $\mu$m. In other embodiments, the reduction in the F-P loss may be up to about 80%.

Figure 7:
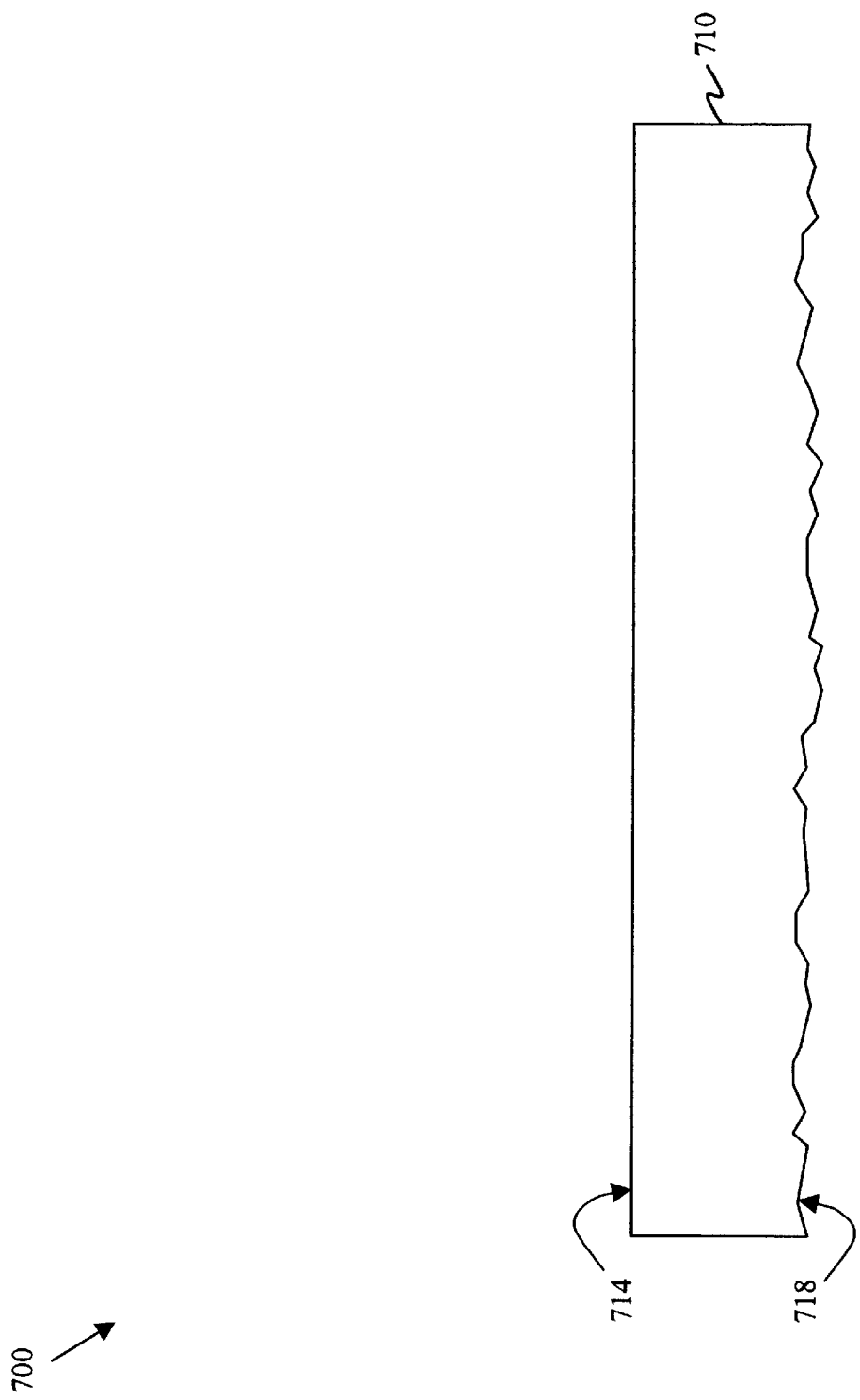
FIGS. 7–11 illustrate detailed manufacturing steps instructing how one might, in a preferred embodiment, manufacture completed mirror depicted in FIG. 6.

Turning to FIGS. 7–11, with continued reference to FIG. 6, illustrated are detailed manufacturing steps for manufacturing the mirror 610 depicted in FIG. 6. FIG. 7 illustrates a cross-sectional view of a partially completed mirror 700, including a mirror substrate 710. As illustrated, the mirror substrate 710 includes opposing first and second sides 714, 718, respectively, wherein the second side 718 is an irregular surface. In an exemplary embodiment, the mirror substrate 710 is a single crystal silicon substrate, however, it should be noted that other similar substrates known to those who are skilled in the art could be used. For example, poly silicon, silicon nitride, silicon carbide, silicon oxide, diamond film, or any combination of these materials may be used as the mirror substrate 710. In an exemplary embodiment, the mirror substrate 710 has a thickness that ranges from about 1000 nm to about 10000 nm.

In the embodiment illustrated in FIG. 7, the second side 718 includes a random pattern of topographical irregularities, however, as discussed below, the surface may be irregular in other ways. It has been found that the random nature of the topographical irregularities on the second side 718 is particularly beneficial. For example, if an optical beam wavelength that is projected against the first side 714 is a Gaussian beam, it is considered a plane wave. In such instances, after transmission through a light reflective optical layer (not shown) on the first side 714 of the substrate 710, the beam should continue to be a plane wave with a flat wave front. However, after reflection from the random pattern of topographical irregularities, the spacial coherence of the beam may be diminished, and the F-P effect, which is based on multiple interference, becomes substantially weaker. In essence, a random surface roughness may be viewed as a sum of many gratings (Fourier expansion). Light diffracted by many different gratings will interfere with a random phase on the second side 718 of the mirror substrate 710, and add incoherently to the incident plane wave. Thus, random patterns may be much more effective in destroying the spacial coherence.

In the embodiment illustrated in FIG. 7, the depth of the topographical irregularities is desired to be approximate to an optical beam wavelength to be projected against the first side 714, divided by 4 times a refractive index of the mirror substrate 710. For example, if an optical beam having a wavelength of about 1.55 $\mu$m were projected against the first side 714 of the mirror substrate 710, and the mirror substrate 710 comprises silicon having a refractive index of about 3.5, a desired depth of the topographical irregularities would be about 110 nm. It should be noted, therefore, that in an advantageous embodiment, the topographical irregularities may have a depth ranging from about 20 nm to about 1000 nm, and in a more specific embodiment may have a depth ranging from about 50 nm to about 200 nm.

In addition to the depth described above, the topographical irregularities may have a roughness scale in terms of planar dimension (rather than the depth dimension) is approximate to the optical beam wavelength to be projected against the first side 514 divided by the refractive index of the mirror substrate 710. In the example where the optical beam has a wavelength of about 1.55 $\mu$m and the substrate is silicon, the roughness might be about 442 nm. Since the random pattern of topographical irregularities is used within this specific embodiment, the roughness may vary substantially across the mirror substrate 710. Thus, in a preferred embodiment, the roughness ranges from about 50 nm to about 5000 nm, and more preferably, ranges from about 100 nm to about 2000 nm. It should be noted that if the roughness is too large, it would generally give smaller diffraction angles and therefore a less efficient destruction of the beam coherency.

The random pattern of topographical irregularities on the second side 718 of the mirror substrate 710 can be achieved by various different fabrication methods. It is possible for the topographical irregularities to be formed using either a subtractive process or an additive process. One such subtractive process includes depositing a random patterned photomask coating so that a distribution of local spots with random size and shape can be exposed for etching, such as illustrated in both embodiments 800, 810, illustrated in FIG. 8. After depositing the random photomask coating 800, 810, a chemical, electrochemical or ion etching could be used to form the topographical irregularities. One skilled in the art understands that after formation of the topographical irregularities, the photomask would be removed using conventional processes.

Alternatively, a surface etching process without lithographic patterning, such as a simple chemical or electrochemical etch, reactive ion etch, plasma etch, or ion milling etch, all of which have been suitably modified to avoid regular patterns, may be used to introduce the random pattern of topographical irregularities. Yet, other alternative mechanical or thermal fabrication methods may be employed to produce the desired inventive second side 718 of the mirror substrate 710, for example using laser surface annealing (e.g., surface evaporation and optional redeposition of evaporated silicon), focused ion beam ablation, and mechanical abrasion, such as miro-shot pinning.

Figure 8:
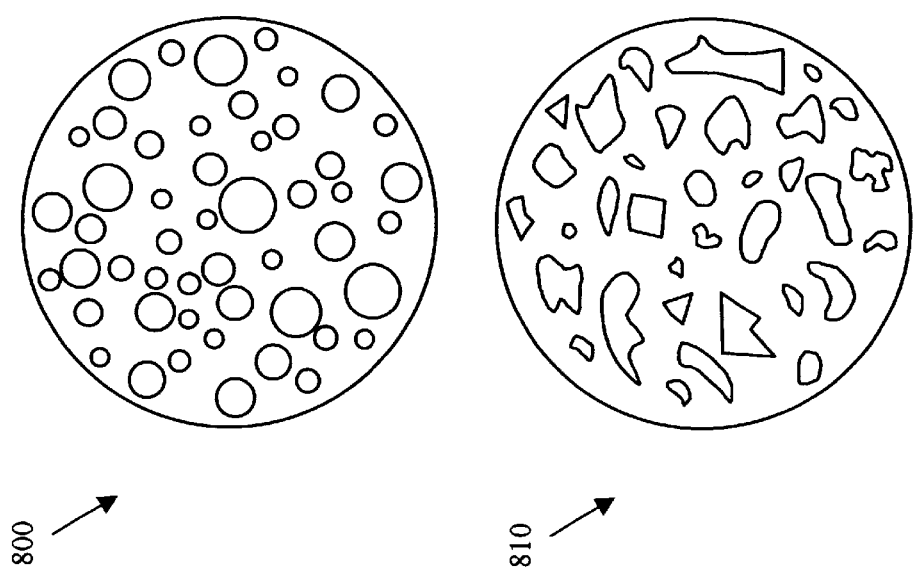
Figure 9:
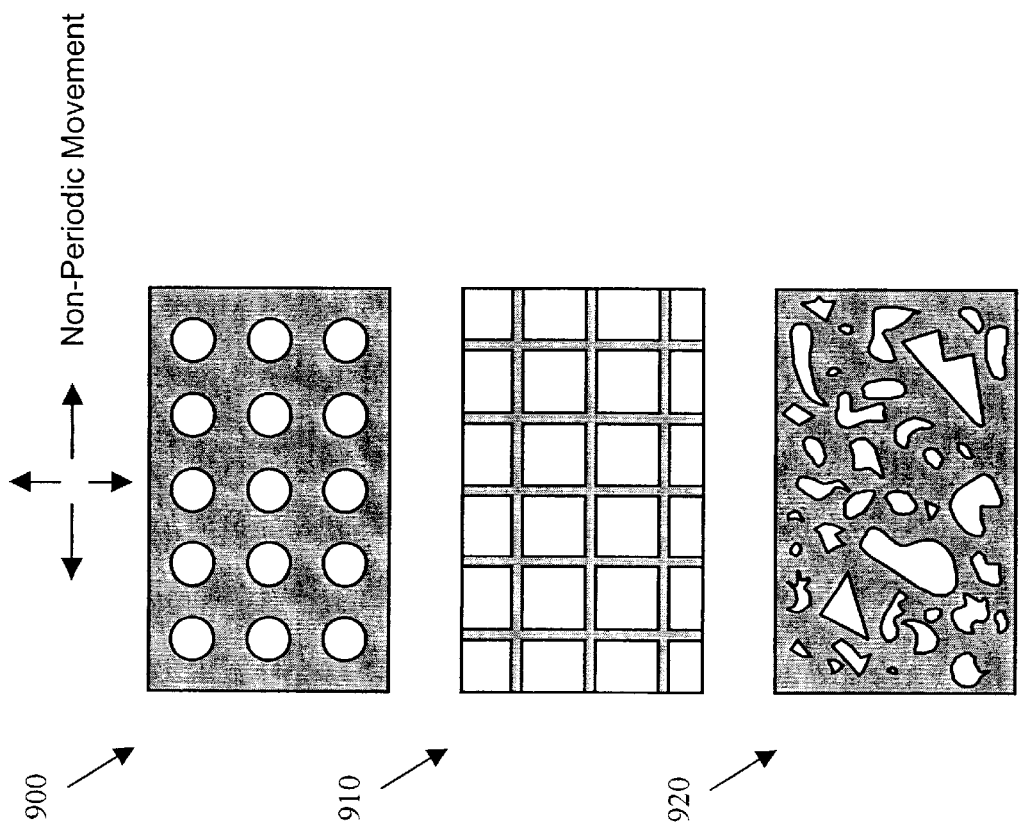

As previously mentioned, instead of the subtractive processes described above, additive processes may also be used in generating the desired random pattern of topographical irregularities. For example, a deposition of silicon material using either patterned epitaxial growth of chemical vapor deposition (CVD) of polysilicon, may be used. The desired random pattern of topographical irregularities may alternatively be produced by an in-situ process using a periodic patterned shadow mask 900, 910, 920, such as shown in FIG. 9. The shadow masks 900, 910, 920, may alternatively be subjected to a random shaking motion during light exposure onto the photomask material or during a subtractive process performed on the second side 718 of the mirror substrate 710, such as laser beam ablation or ion beam etching. In this process, the fabrication of the random photomask coating 800, 810, of FIG. 8, is no longer necessary to provide the random pattern of topographical irregularities.

While a detailed list of additive and subtractive fabrication processes has been outlined above as possibilities for forming the random pattern of topographical irregularities, one skilled in the art understands that many other processes could be used to form the random pattern of topographical irregularities. It should also be noted that any combination of any known or unknown processes could also be used to form the random pattern of topographical irregularities.

Figure 10:
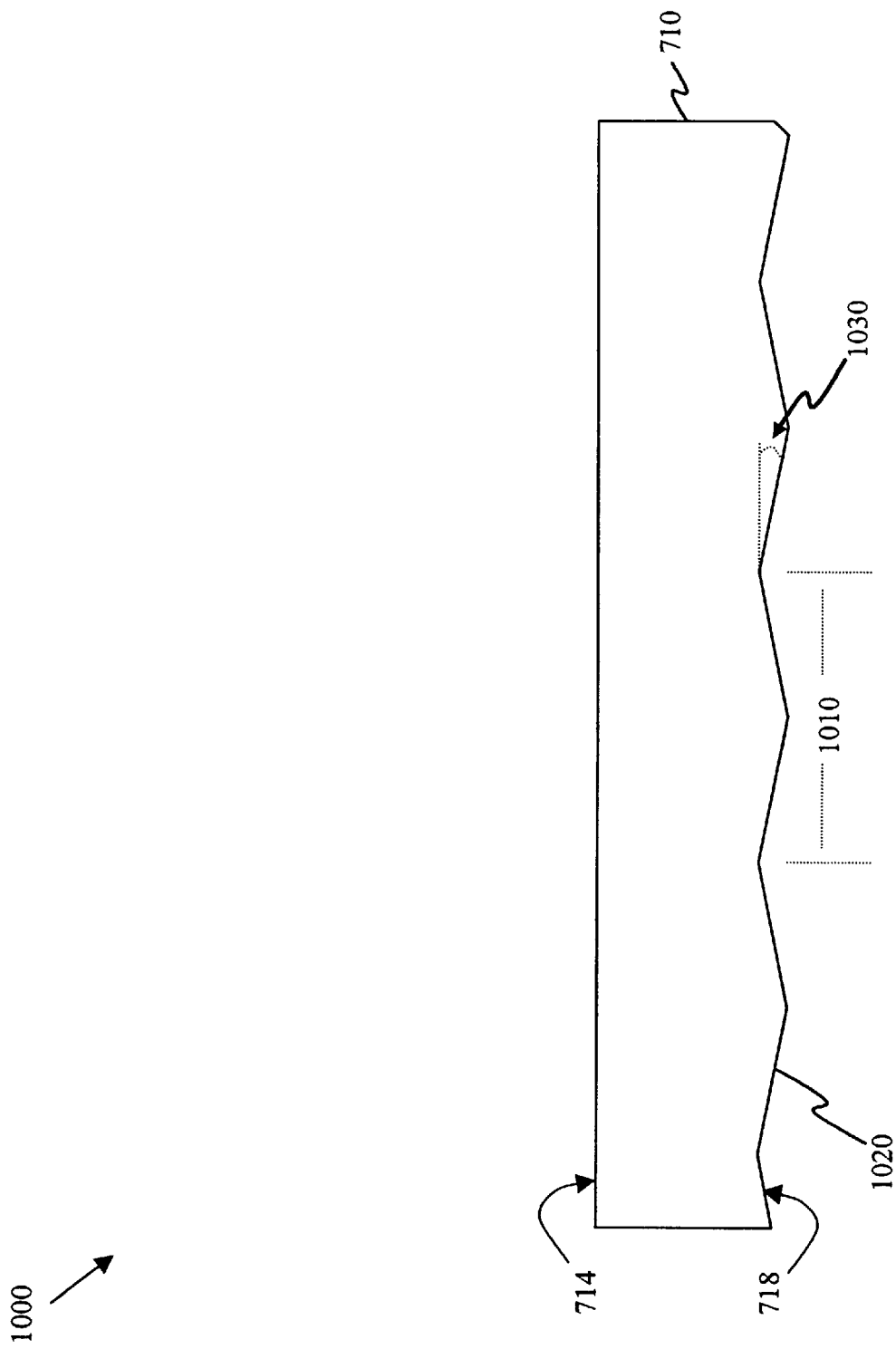

Turning to FIG. 10, illustrated is an alternative embodiment of the mirror substrate 710 having a second side 718 containing the irregular surface. In contrast to the embodiment illustrated in FIG. 7, the irregular surface in the embodiment shown in FIG. 10 includes a periodic pattern 1010 of macro-scale topographical irregularities, the lateral (or in-plane) dimension of which is desirably at least 5 times larger, and preferably at least 20 times larger, than the wavelength of the light beam used. The embodiment illustrated in FIG. 10 further includes a number of multiple surfaces 1020, wherein each of the multiple surfaces 1020 is not parallel with the first side 714. In an exemplary embodiment, there are at least about 4, and preferably at least about 8 multiple surfaces 1020. The use of the non-parallel multiple surfaces 1020 reduces the F-P loss by substantially reducing the amount of constructive interferrometric interaction that might occur. To further elaborate on the use of geometrical structures containing non-parallel reflective surfaces to reduce constructive interferrometric interaction, see the book by E. Hecht, Optics, 3rd edition, Addison-Wesley, New York, 1998, p. 413–416, which is incorporated herein by reference.

The multiple surfaces 1020 may take the form of a concentric ring geometry of V-grooves, may be in the form of many inverted pyramid shapes or may take the form of many other applicable periodic patterns. In one illustrative embodiment, each of the multiple surfaces 1020 is at least an angle 1030 of about 0.2 degrees off parallel 1030 from the first side 714. It should be noted, however, that each of the multiple surfaces 1020 may embody an angle 1030 that is more than just about 0.2 degrees off parallel and still be within the scope of the present invention, including multiple surfaces 1020 having an angle 1030 that is about 5 degrees off parallel. While the embodiment illustrated in FIG. 10 shows multiple surfaces 1020 that are not in parallel with the first side 714, curved surfaces, such as might be included within a sinusoidal second side 718, are also within the scope of the present invention. While many different geometries may be used, it is desired for the periodicity of the multiple surfaces 1020 to be symmetrical with respect to an electrode (not shown) positioned thereunder. In such an instance, a distance from the multiple surfaces 1020 to an electrode in a relaxed position, are similar.

The illustrative embodiment shown in FIG. 10 may be fabricated using many of the same fabrication techniques applicable to the embodiment illustrated in FIG. 7. More specifically, the periodic pattern of topographical irregularities may be fabricated within the second side 718 of the mirror substrate 710 by chemical etching, reactive ion etching, focused ion beam etching, sputter etching, laser ablation or other known silicon etch processes using, if necessary, crystallographically anisotropic etching characteristics of certain chemicals such as KOH, and photolithographic patterning.

Figure 11:
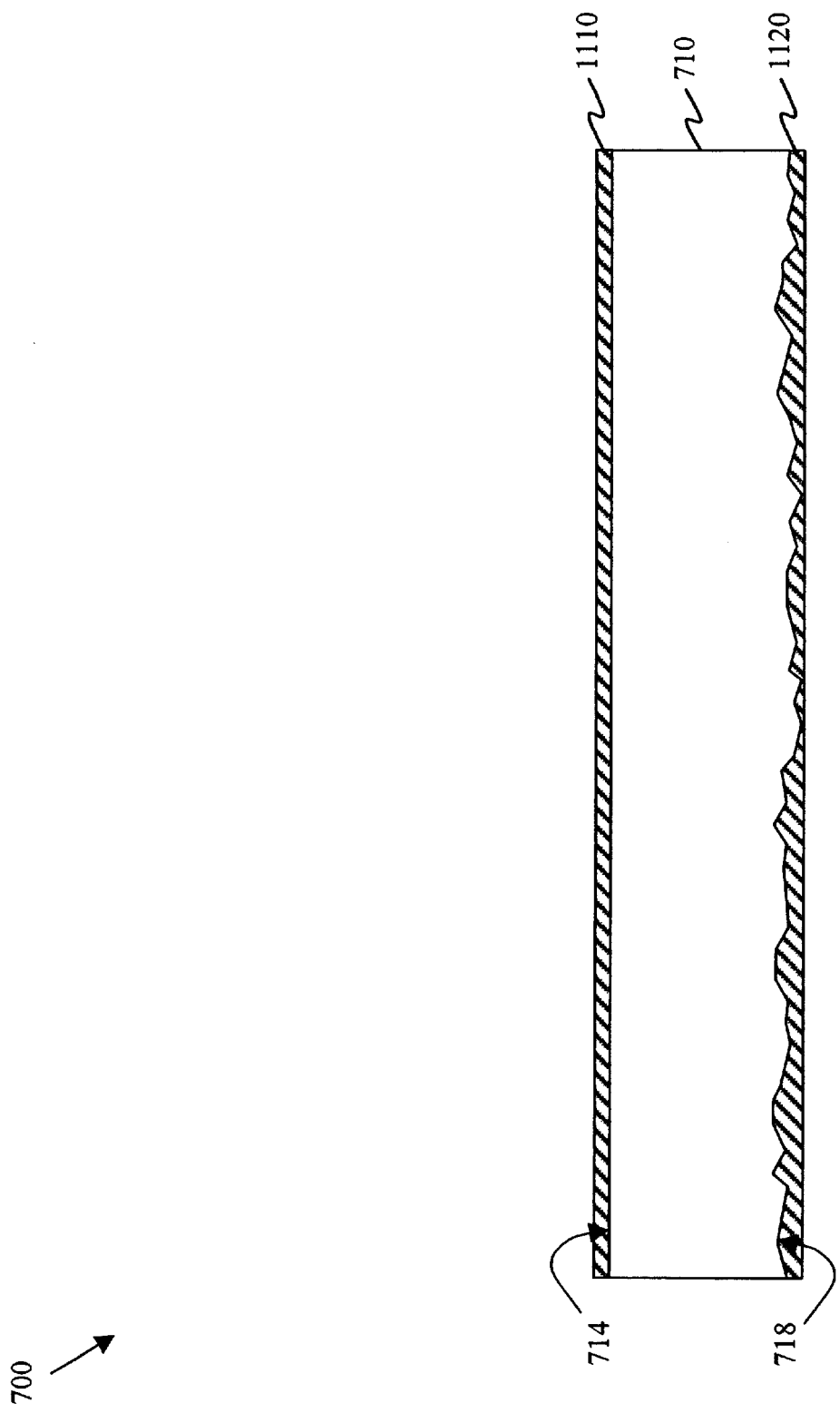

Turning to FIG. 11, desirably formed over the first side 714 of the mirror substrate 710 is a light reflective optical layer 1110. In the specific embodiment shown in FIG. 11, the light reflective optical layer 1110 is formed directly on the first side of the mirror substrate 710. It should be noted, however, that an adhesion layer (not shown) may be formed between the light reflective optical layer 1110 and the first side 714 of the mirror substrate 710, in order to prevent the light reflective optical layer 1110 from peeling off the mirror substrate 710, due to poor adhesion. This is particularly important if a noble metal based metallization is used for the light-reflective optical layer 1110, such as gold, silver, palladium and platinum. The chemical inertness of these metals generally results in poor adhesion onto the mirror substrate 710. Exemplary adhesion-promoting layers may comprise chromium, titanium, zirconium or hafnium. A desired thickness of the adhesion layer ranges from about 1 nm to about 100 nm and more preferably from about 2 nm to about 20 nm.

In an exemplary embodiment, a stress balancing layer 1120 may be formed over the second side 718 of the mirror substrate 710. In one illustrative embodiment of the present invention, the stress balancing layer 1120 and the light reflective optical layer 1110 comprise a similar material and a similar thickness, so as to exactly or closely counterbalance any stress caused by the light reflective optical layer 1110. Additionally, the light reflective optical layer 1110 and the stress balancing layer 1120 may be formed one at a time, or in an exemplary embodiment, formed concurrently. The stress balancing layer 1120 substantially reduces many of the mirror curvature and temperature dependent change problems arising from the use of single-sided metallization mirrors. At least one adhesion-promoting bond layer may be desirably added between the second side 718 of the mirror substrate 710 and the stress balancing layer 1120.

The light reflective optical layer 1110 and the stress balancing layer 1120 may comprise any material that is generally known to reflect light. In one advantageous embodiment, the light reflective optical layer 1110 or the stress balancing layer 1120 comprise a metal light reflective optical layer. In such an embodiment, the metal may comprise any metallic material that reflects light with high reflectivity. For example, in a preferred embodiment, the light reflective optical layer 1110 or the stress balancing layer 1120 may comprise gold, silver, rhodium, platinum, copper or aluminum.

The light reflective optical layer 1110 and the stress balancing layer 1120 may be formed using many processes. For instance, they can be deposited by known thin film deposition methods such as evaporation, sputtering, electro-chemical deposition, or chemical vapor deposition. Moreover, they may typically be formed to a thickness ranging from about 20 nm to about 2000 nm.

Figure 12:
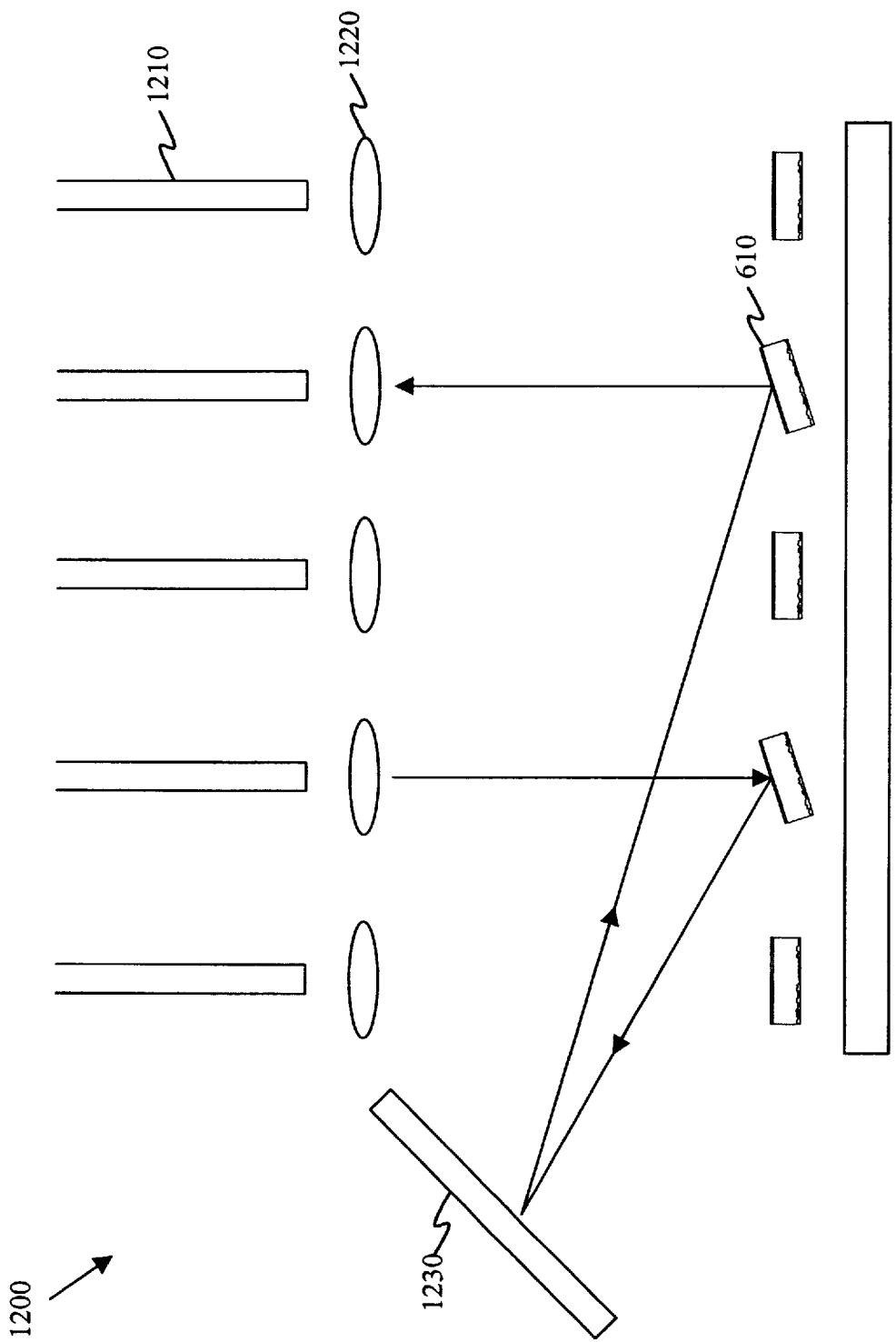
FIG. 12 illustrates an optical communications system, which provides one environment where the mirror may be used.

Turning to FIG. 12, illustrated is an optical communications system 1200. In the embodiment shown in FIG. 12, the optical communications system 1200 includes input/output fiber bundles 1210, the mirrors 610 illustrated in FIG. 6, imaging lenses 1220 interposed between the input/output fiber bundles 1210 and the mirrors 610, and a reflector 1230. The optical communications system 1200 represents an optical cross-connect, which is one environment where the mirror 610 may be used.

Figure 13:
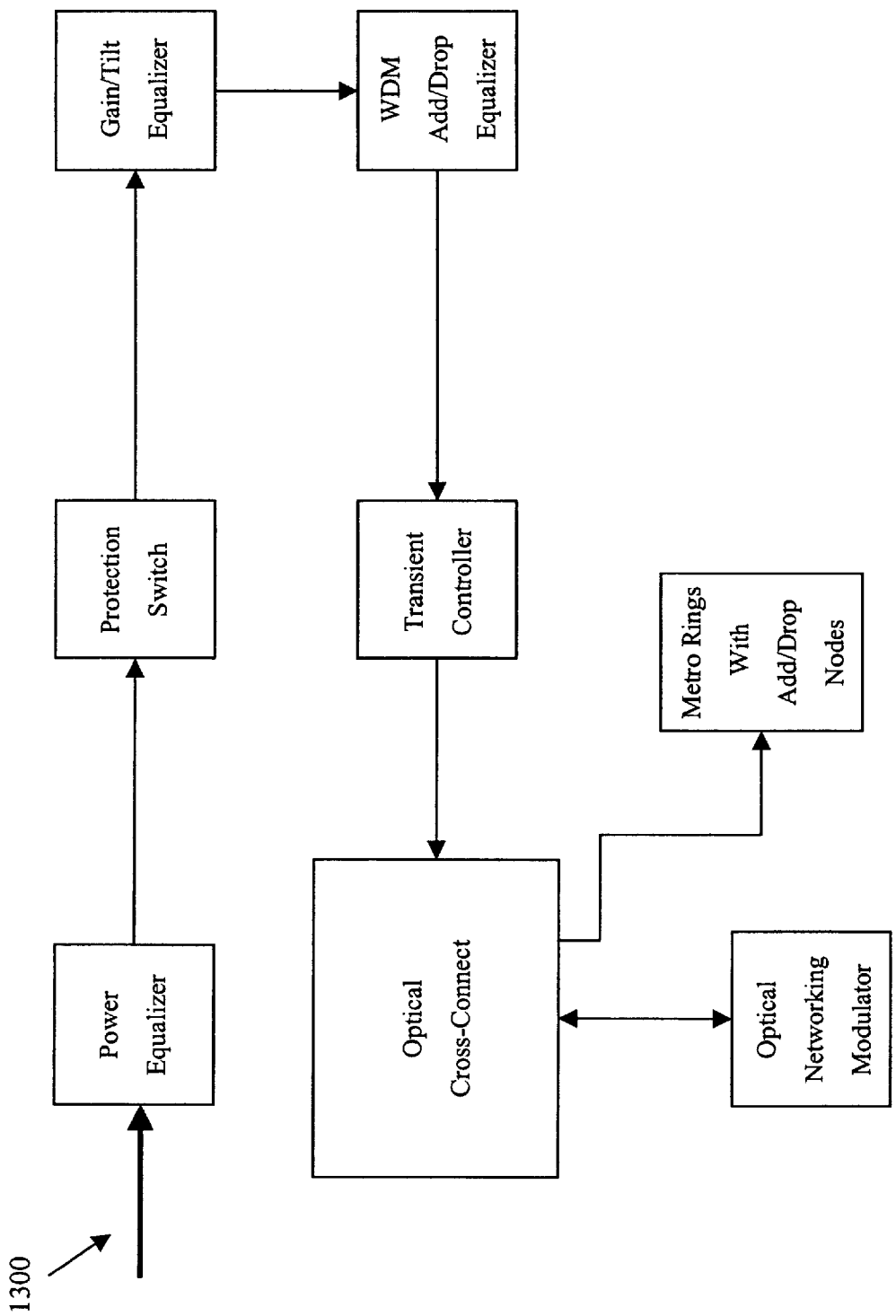
FIG. 13 illustrates an optical networking system incorporating the inventive mirror.

The inventive mirror 610, with stabilized mirror arrays, is useful not only for channel cross-connect, but also for signal re-routing, or signal modification in optical communication networking system. Schematically illustrated in FIG. 13 is an example of such a communication system 1300 comprising an optical cross connect, and other functional devices. In the cross connect, each mirror 610 receives an optical signal from an incoming channel, and reflects it toward an intended output channel location. The input signal may contain many wavelengths, or alternatively, can be demultiplexed into separate wavelength channels. The inventive mirror 610 is also useful for various other light-reflecting mirror systems, since the stability of mirror curvature is essential for reliable operation of most of the MEMS based optical devices. Examples of such devices include those shown in FIG. 13, such as power gain equalizers, switches, wavelength-division-multiplexer (WDM) add/drop devices, optical modulators and optical signal attenuators.

Multi-wavelength optical communication systems will require reconfiguration and reallocation of wavelengths among the various nodes of a network depending on user requirements, e.g., with programmable add/drop elements. One problem limiting the capacity of such systems is that the erbium-doped fiber amplifier, which is often a necessary component in optical communication systems, has a characteristic spectral dependence providing different gain for different wavelength channels. This spectral dependence poses a problem for multichannel WDM systems, because different gains for different channels leads to high bit error rates in some of the channels. As the number of channels passing through the amplifier changes by channel add/drop reconfiguration, the amplifier will start showing deleterious peaks in its gain spectrum at some wavelength channels, requiring modification of the signal spectrum and flattening of the amplifier gains.

One way of flattening the amplifier gain spectrum is to use long period fiber gratings. Long-period fiber grating devices provide wavelength dependent loss and may be used for spectral shaping. See an article by A. M. Vengsarkar et al., *Optical Letters* Vol.21, p.336, (1996). A long-period grating couples optical power between two co-propagating modes with very low back reflections. A long-period grating typically comprises a length of optical waveguide wherein a plurality of refractive index perturbations are spaced along the waveguide by a periodic distance, which is large compared to the wavelength of the transmitted light. Long-period fiber grating devices selectively remove light at specific wavelengths by mode conversion. In contrast with conventional Bragg gratings, in which light is reflected and stays in the waveguide core, long-period gratings remove light without reflection, as by converting it from a guided mode to a non-guided mode. A non-guided mode is a mode which is not confined to the core, but rather, is defined by the entire waveguide structure, e.g., based on a cladding mode.

A difficulty with conventional long-period gratings, however, is that their ability to dynamically equalize amplifier gain is limited, because they filter only a fixed wavelength acting as wavelength-dependent loss elements. Such dynamic gain equalizers based on reconfigurable long-period gratings have been disclosed, for example, in the U.S. Pat. No. 5,999,671 (Jin, et al.). It is desirable to be able to equalize amplifier gains over a broad range of wavelengths covering many wavelength channels. Therefore, it would be beneficial to utilize many simultaneously operating mirrors, similar to the mirror 610, each representing one specific demultiplexed wavelength. The design and size scale of the dynamic gain equalizer devices is tailored so that the range of wavelength spectrum and the number of wavelength channels simultaneously controllable, can be optimized and increased if necessary.

In the inventive dynamic gain equalizer based on the mirror 610, the optical signal gain in each wavelength channel can be independently, and simultaneously with other channels, controlled by a multitude of mirrors such as the mirror 610, which reflects that particular signal. The multiplexed optical signal is demultiplexed using suitable demultiplexers such as planar waveguides or thin film devices, with each of the separated wavelength channel signals being sent to each mirror 610 and reflected. By programmably selecting the tilt angle of relevant mirrors slightly off the angle of maximum signal reflection, the losses for various wavelength channels can be intentionally increased to different degrees for the purpose of gain equalizing. The stability of mirror curvature enhanced by the present invention is crucial in ensuring the accuracy of dynamic gain control by different mirrors.

Figure 14:
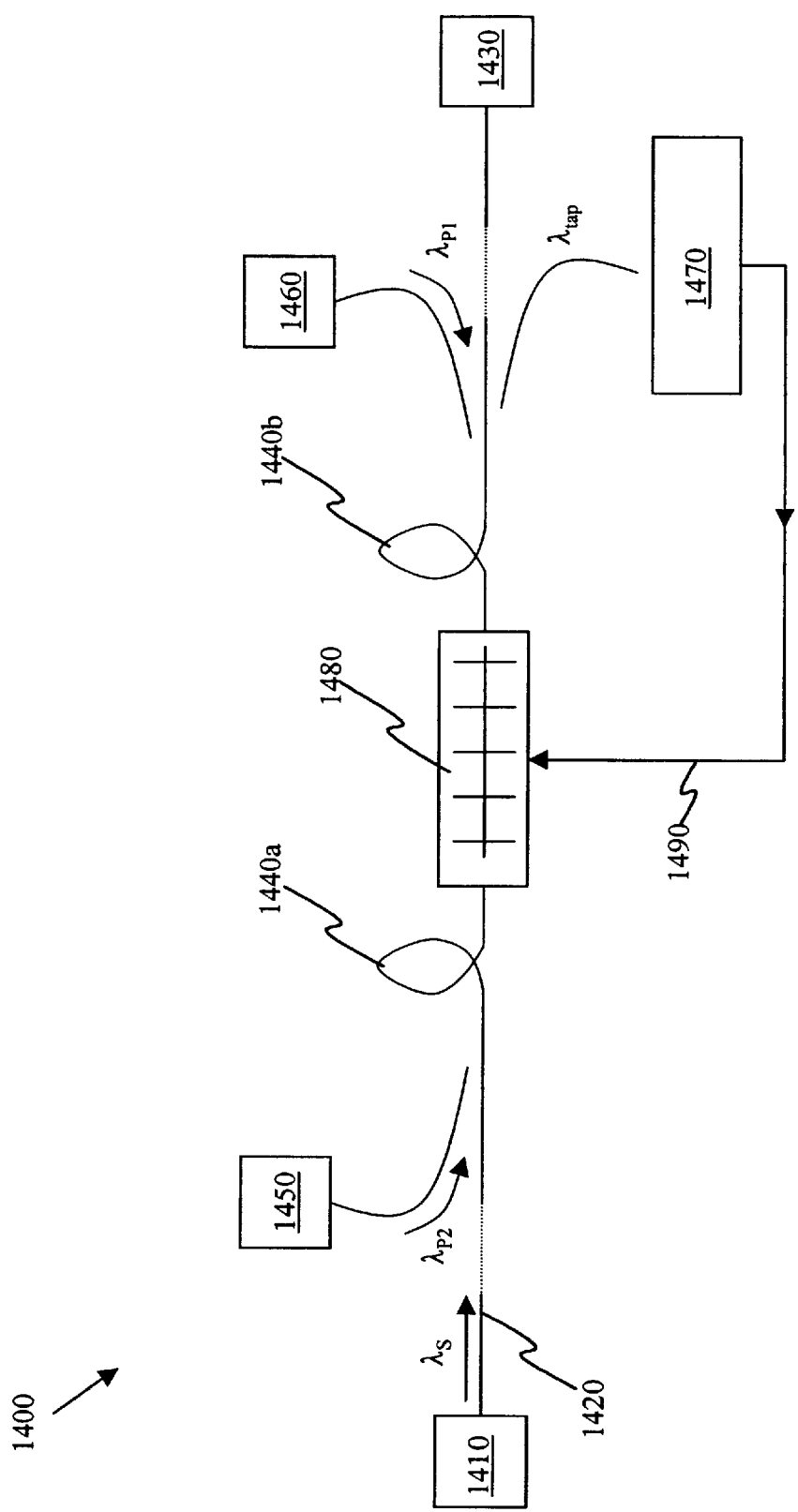
FIG. 14 illustrates an optical communication system comprising a dynamic gain equalizer according to the invention.

Referring to FIG. 14, illustrated is an exemplary optical communication system comprising the mirror 610 according to the invention. The system 1400 comprises dynamically gain-equalized optical amplifiers, a reconfigurable MEMS mirror-type spectral shaping device, and a feedback device. Specifically, the system 1400 comprises a transmitter source 1410 of optical signals such as a digitally modulated 1.55 $\mu$m signal, an optical signal path comprising a length of optical fiber 1420 for transmitting the signal, and a receiver 1430 for receiving and demodulating the signal. One or more optical amplifiers, such as erbium-doped fiber amplifiers 1440*a*, 1440*b*, are disposed in the optical signal path for amplifying the transmitted signal. The amplifiers are pumped by pump sources 1450, 1460, of optical energy having pump wavelengths $\lambda_{p1}$ and $\lambda_{p2}$.

One of the preferred uses of the device of FIG. 14 is to reduce spectral dependence in the gain output of an optical amplifier. For example, the characteristic gain spectrum of an erbium-doped optical fiber amplifier has a pair of gain peaks at about 1.53 μm and at about 1.56 μm. Thus, a signal at 1.53 μm will be amplified more than one at 1.54 μm, which would be disadvantageous in a wavelength division multiplexing (WDM) system.

By properly demultiplexing the optical signal and sending it to different light-reflecting mirrors for separately programmed attenuation of signal strengths, and by optional tuning of the mirror reflections via a feedback system, the gain spectrum of the amplifier device combination can be made substantially flat over a range of wavelengths. The tunable system 1480 comprises a demultiplexer in combination with a tunable light-reflecting MEMS mirror device and a multiplexer to put together the different wavelength channels into the optical fiber. The device 1480 is connected to a feedback system 1490, having a wavelength detector 1470 coupled to the fiber 1420 for detecting the wavelength response $\lambda_{tap}$. The feedback system 1490 automatically adjusts the tuning of the device 1480 depending upon $\lambda_{tap}$. Advantageously, system 1400 can be a WDM system using a plurality of different wavelength signals, e.g., $\lambda_{s1}$ and $\lambda_{s2}$, and a plurality of tunable MEMS mirror devices coupled to one or more detectors.

The device 600 can also be useful as a multi-channel optical add/drop device. Modern, high-density optical communications utilize wavelength division multiplexed communication systems which employ multiplexer/ demultiplexer devices. In such systems, a "trunk" fiber carries optical signal channels at several wavelengths $\lambda_1$, $\lambda_2$, . . . $\lambda_n$ and it is desirable to extract a single wavelength channel from the trunk fiber or to add a single wavelength channel onto the trunk. A wide variety of such devices can be made, for example, by interconnecting optical circulators and tunable fiber Bragg gratings. See, U.S. Pat. No. 5,781,677 by Jin et al. Typically the channel reflected by the grating is dropped to the trunk fiber or is added to the trunk. Gratings as described herein permit selection at the grating of which channel is dropped or added. The mirror 610 allows channel add/drop operation in a free-space mode thus providing a convenient capability to carry out the add/drop operations for many hundreds or even thousands of channels simultaneously.

Filters and attenuators are useful in communication systems to change the power levels of various signals. In modern communications systems, variable attenuators are becoming increasingly more important, especially in dense wavelength-division multiplexed (DWDM) systems. Variable attenuators are used to vary the amount of loss light will experience as it passes through the system. This loss may range from low loss (<1 dB), to very high loss (>30 dB). The mechanism by which the attenuators induce loss in the signals may be attributable to coupling loss between fibers, polarization loss, absorption loss, scattering loss, or any combination of these.

Variable attenuators typically include complicated structures with moving parts that rotate or otherwise move the position of the fibers or a separate attenuator device. For example, U.S. Pat. No. 5,745,634 to Garrett, et al.,"Voltage Controlled Attenuator," issued Apr. 28, 1998, shows a variable attenuator with which the variation in attenuation is obtained by actuating a DC motor which displaces the position of the attenuator. U.S. Pat. No. 5,677,977 to Smith, "Optical Attenuator," issued Oct. 14, 1997, shows a variable attenuator with which the variation in attenuation is obtained by providing a circular loop of optical fiber which is rotated with use of a lockable rotating shaft clamped to the side of the loop. U.S. Pat. No. 5,781,341 to Lee, "Motorized Tunable Filter and Motorized Variable Attenuator," issued Jul. 14, 1998, shows a variable attenuator with use of a cam attached to a collimator; the cam rotates the collimator to adjust the loss.

A variable attenuator based on coupling loss is typically composed of two separated fibers whose separation is controlled with mechanical motion. As the amount of the separation between the fibers increases, the amount of loss also increases. See, for example, Brenner et al., "Low-Reflectivity In-Line Variable Attenuator Utilizing Optical Fiber Tapers, " J. LIGHTWAVE TECH., Vol. 18 (1990), at p. 7, which is incorporated herein by reference.

Figure 15:
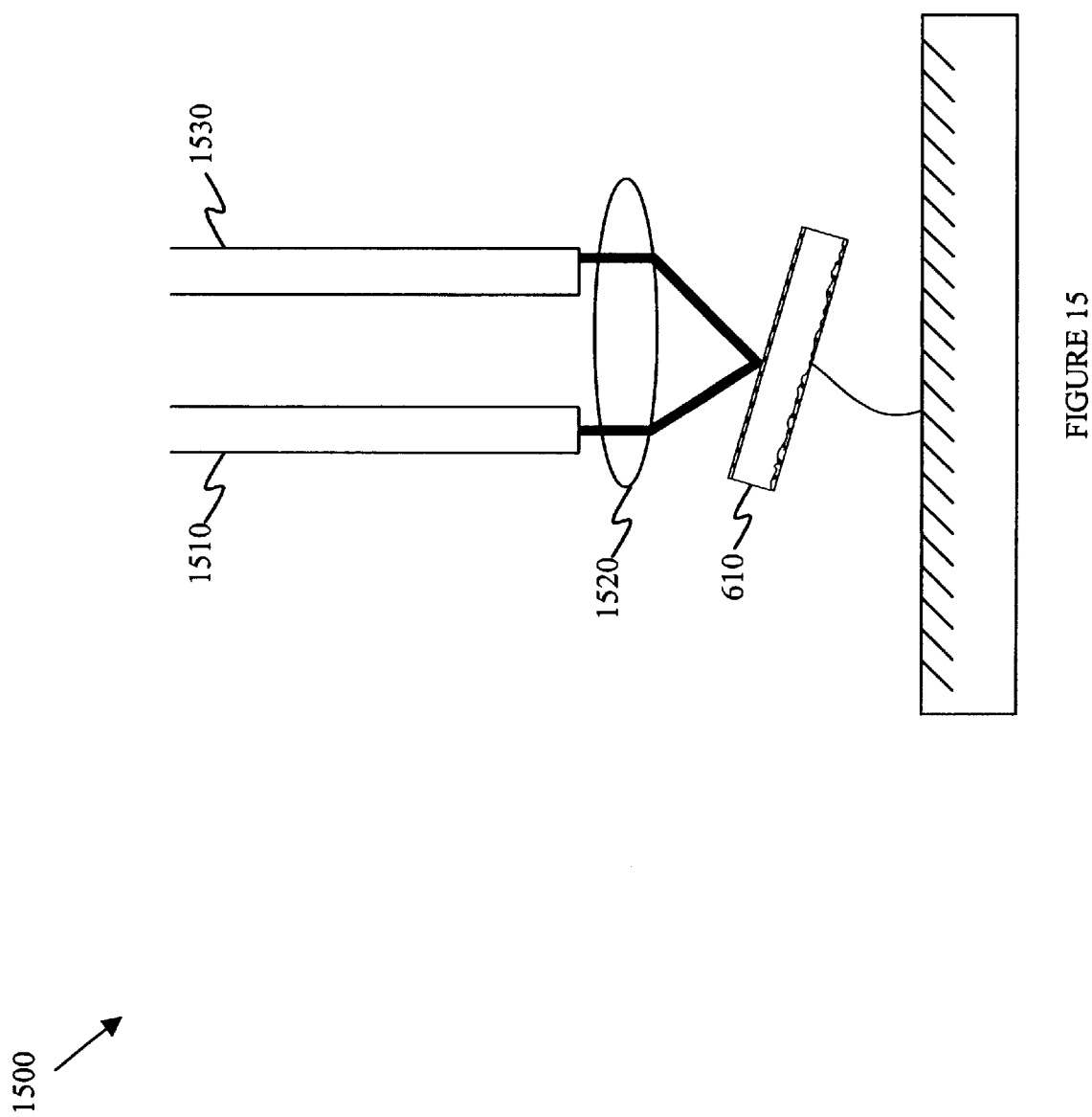
FIG. 15 illustrates an optical signal modulator comprising the improved mirror, according to the invention.

As can be seen, variable attenuators typically have involved use of bulk moving parts and are not always amenable to small, high-density device arrays. As may be appreciated, those concerned with the development of optical communications systems continually search for new components and designs including new attenuator designs. As optical communications systems become more advanced, there is growing interest in reducing the dimension of the attenuator devices, and in increasing the number of wavelength channels that may be transmitted, relayed, modulated/ attenuated, filtered, or switched. The instant invention comprising the mirror 610, such as schematically illustrated in FIG. 15, provides a variable attenuator device that may be used to reliably achieve desired signal attenuation in many channels. Also included within the embodiment shown in FIG. 15, are a first fiber optic line 1510, a lense 1520, the mirror 610 and a second offset fiber optic line 1530.

The inventive methods and structures can also be applied to devices which are not MEMS type devices. Any light-reflecting system comprising a mirror or an array of mirrors with the light reflective optical layer 630 and the stress balancing layer 660 can be improved by the insertion of the irregular surface. For example, the mirror size may be larger than about 1 cm in diameter.

Although the present invention has been described in detail, those skilled in the art should understand that they can make various changes, substitutions and alterations herein without departing from the spirit and scope of the invention in its broadest form.

What is claimed is:

1. For use with a micro-electro-mechanical system (MEMS) optical device, a movable element comprising:
   a substrate having opposing first and second sides, wherein the first side has a light reflective optical layer located thereover and the second side is an irregular surface, wherein the irregular surface reduces interferometric loss associated with the movable element.

2. The device as recited in claim 1 further including a stress balancing layer located over the second side.

3. The device as recited in claim 1 wherein the irregular surface includes a random pattern of topographical irregularities.

4. The device as recited in claim 3 wherein a depth of the topographical irregularities is approximate to an optical beam wavelength to be projected against the first side divided by 4 times a refractive index of the substrate.

5. The device as recited in claim 4 wherein the depth ranges from about 20 nm to about 1000 nm.

6. The device as recited in claim 4 wherein the depth ranges from about 50 nm to about 200 nm.

7. The device as recited in claim 3 wherein the random pattern has a roughness scale in terms of planar dimension that is approximate to an optical beam wavelength to be projected against the first side divided by a refractive index of the substrate.

8. The device as recited in claim 7 wherein the roughness ranges from about 50 nm to about 5000 nm.

9. The device as recited in claim 7 wherein the roughness ranges from about 100 nm to about 2000 nm.

10. The device as recited in claim 1 wherein the irregular surface includes a periodic pattern of macro-scale topographical irregularities.

11. The device as recited in claim 10 wherein the periodic pattern of macro-scale topographical irregularities has a roughness scale in terms of planar dimension that is approximate to about five times an optical beam wavelength to be projected against the first side.

12. The device as recited in claim 10 wherein the periodic pattern of macro-scale topographical irregularities has a roughness scale in terms of planar dimension that is approximate to about twenty times an optical beam wavelength to be projected against the first side.

13. The device as recited in claim 10 wherein the periodic pattern includes a number of multiple surfaces, wherein each surface is not parallel with the first side.

14. The device as recited in claim 13 wherein the number of multiple surfaces is at least about 4.

15. The device as recited in claim 13 wherein each surface is at least about 0.2 degrees off parallel from the first side.

16. The device as recited in claim 13 wherein each surface is at least about 5 degrees off parallel from the first side.

17. The device as recited in claim 10 wherein the periodic pattern includes surfaces selected from the group consisting of planar surfaces and curved surfaces.

18. A method of manufacturing a movable element for use in a micro-electro-mechanical system (MEMS) optical system, comprising:
   forming a substrate having opposing first and second sides, wherein the second side has an irregular surface that reduces interferrometric loss associated with the movable element; and
   forming a light reflective optical layer over the first side.

19. The method as recited in claim 18 further including forming a stress balancing layer over the second side.

20. The method as recited in claim 18 wherein forming a second side having an irregular surface includes forming a second side having a random pattern of topographical irregularities.

21. The method as recited in claim 20 wherein forming a second side having a random pattern of topographical irregularities includes forming a second side having a random pattern of topographical irregularities with a depth that is approximate to an optical beam wavelength to be projected against the first side divided by 4 times a refractive index of the substrate.

22. The method as recited in claim 21 wherein forming a second side having a random pattern of topographical irregularities with a depth includes forming a second side having a random pattern of topographical irregularities with a depth ranging from about 20 nm to about 1000 nm.

23. The method as recited in claim 21 wherein forming a second side having a random pattern of topographical irregularities with a depth includes forming a second side having a random pattern of topographical irregularities with a depth ranging from about 50 nm to about 200 nm.

24. The method as recited in claim 20 wherein forming a second side having a random pattern includes forming a second side having a roughness scale in terms of planar dimension that is approximate to an optical beam wavelength to be projected against the first side divided by a refractive index of the substrate.

25. The method as recited in claim 24 wherein forming a second side having a roughness includes forming a second side having a roughness that ranges from about 50 nm to about 5000 nm.

26. The method as recited in claim 24 wherein forming a second side having a roughness includes forming a second side having a roughness that ranges from about 100 nm to about 2000 nm.

27. The method as recited in claim 18 wherein forming a second side having an irregular surface includes forming a second side having a periodic pattern of macro-scale topographical irregularities.

28. The method as recited in claim 27 wherein forming a second side having a periodic pattern of macro-scale topographical irregularities includes forming a second side having a periodic pattern of macro-scale topographical irregularities having a roughness scale in terms of planar dimension that is approximate to about five times an optical beam wavelength to be projected against the first side.

29. The method as recited in claim 27 wherein forming a second side having a periodic pattern of macro-scale topographical irregularities includes forming a second side having a periodic pattern of macro-scale topographical irregularities having a roughness scale in terms of planar dimension that is approximate to about twenty times an optical beam wavelength to be projected against the first side.

30. The method as recited in claim 27 wherein forming a second side having a periodic pattern of topographical irregularities includes forming a second side having a number of multiple surfaces, wherein each surface is not parallel with the first side.

31. The method as recited in claim 30 wherein forming a second side having a number of multiple surfaces includes forming a second side having at least about 4 surfaces.

32. The method as recited in claim 30 wherein forming a second side having a number of multiple surfaces includes forming a second side having a number of multiple surfaces wherein each surface is at least about 0.2 degrees off parallel from the first side.

33. The method as recited in claim 30 wherein forming a second side having a number of multiple surfaces includes forming a second side having a number of multiple surfaces wherein each surface is at least about 5 degrees off parallel from the first side.

34. The method as recited in claim 27 wherein forming a second side having a periodic pattern includes forming a second side having surfaces selected from the group consisting of planar surfaces and curved surfaces.

35. The method as recited in claim 18 wherein forming a second side having an irregular surface includes forming a second side having an irregular surface by a subtractive process or an additive process.

36. The method as recited in claim 35 wherein the subtractive process may be selected from the group consisting of an etching process, a mechanical process and a thermal process.

37. The method as recited in claim 35 wherein the additive process may be selected from the group consisting of patterned epitaxial growth and chemical vapor deposition.

38. An optical communications system, comprising:
  input/output fiber bundles;
  a micro-electro-mechanical structure, comprising:
    a mirror including a substrate having opposing first and second sides, wherein the first side has a light reflective optical layer located thereover and the second side is an irregular surface that reduces interferrometric loss associated with the movable element; and
    a mounting substrate on which the mirror is movably mounted;
  imaging lenses interposed between the input/output fiber bundles and the micro-electro-mechanical structure; and
  a reflector.

39. The optical communications system as recited in claim 38 further including a stress balancing layer located over the second side.

40. The optical communications system as recited in claim 38 wherein the irregular surface includes a random pattern of topographical irregularities.

41. The optical communications system as recited in claim 40 wherein a depth of the topographical irregularities is approximate to an optical beam wavelength to be projected against the first side divided by 4 times a refractive index of the substrate.

42. The optical communications system as recited in claim 41 wherein the depth ranges from about 20 nm to about 1000 nm.

43. The optical communications system as recited in claim 41 wherein the depth ranges from about 50 nm to about 200 nm.

44. The optical communications system as recited in claim 40 wherein the random pattern has a roughness scale in terms of planar dimension that is approximate to an optical beam wavelength to be projected against the first side divided by a refractive index of the substrate.

45. The optical communications system as recited in claim 44 wherein the roughness ranges from about 50 rim to about 5000 nm.

46. The optical communications system as recited in claim 44 wherein the roughness ranges from about 100 nm to about 2000 nm.

47. The optical communications system as recited in claim 38 wherein the irregular surface includes a periodic pattern of macro-scale topographical irregularities.

48. The optical communications system as recited in claim 47 wherein the periodic pattern of macro-scale topographical irregularities has a roughness scale in terms of planar dimension that is approximate to about five times an optical beam wavelength to be projected against the first side.

49. The optical communications system as recited in claim 47 wherein the periodic pattern of macro-scale topographical irregularities has a roughness scale in terms of planar dimension that is approximate to about twenty times an optical beam wavelength to be projected against the first side.

50. The optical communications system as recited in claim 47 wherein the periodic pattern includes a number of multiple surfaces, wherein each surface is not parallel with the first side.

51. The optical communications system as recited in claim 48 wherein the number of multiple surfaces is at least about 4.

52. The optical communications system as recited in claim 51 wherein each surface is at least about 0.2 degrees off parallel from the first side.

53. The optical communications system as recited in claim 51 wherein each surface is at least about 5 degrees off parallel from the first side.

54. The optical communications system as recited in claim 47 wherein the periodic pattern includes surfaces selected from the group consisting of planar surfaces and curved surfaces.

55. The optical communications system recited in claim 38 that comprises one or more devices selected from the group consisting of:
  a micro-electro-mechanical system (MEMS) optical cross connect system;
  an optical power gain equalizer system;
  a wavelength division multiplexing telecommunications system;
  a light signal switch in an optical communications system; and
  a variable optical attenuator in an optical communications system.

* * * * *